(12) United States Patent
Matsumoto

(10) Patent No.: US 8,258,471 B2
(45) Date of Patent: Sep. 4, 2012

(54) PATTERN MEASURING APPARATUS AND PATTERN MEASURING METHOD

(75) Inventor: Jun Matsumoto, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/136,613

(22) Filed: Aug. 5, 2011

(65) Prior Publication Data

US 2012/0032077 A1 Feb. 9, 2012

(30) Foreign Application Priority Data

Aug. 9, 2010 (JP) ................. 2010-178310

(51) Int. Cl.
*H01J 37/26* (2006.01)
*H01J 37/304* (2006.01)
*G01N 23/22* (2006.01)

(52) U.S. Cl. ........ 250/306; 250/307; 250/310; 250/311; 250/397; 250/396 R; 250/492.22

(58) Field of Classification Search ............ 250/307, 250/306, 310, 311, 397, 396 R, 492.22
See application file for complete search history.

(56) References Cited

U.S. PATENT DOCUMENTS

| | | | | |
|---|---|---|---|---|
| 6,646,262 B1 * | 11/2003 | Todokoro et al. | ......... | 850/9 |
| 7,399,966 B2 * | 7/2008 | Todokoro et al. | ......... | 250/310 |
| 7,590,506 B2 * | 9/2009 | Matsumoto | ......... | 702/167 |

FOREIGN PATENT DOCUMENTS

| | | |
|---|---|---|
| JP | 05-296754 | 11/1993 |
| JP | 2005-195361 | 7/2005 |
| JP | 2007-292732 | 11/2007 |

* cited by examiner

*Primary Examiner* — Nikita Wells
(74) *Attorney, Agent, or Firm* — Muramatsu & Associates

(57) ABSTRACT

A pattern measurement apparatus and a pattern measurement method are capable of easily distinguishing a line pattern and a space pattern from one another, without being affected by the luminance of the pattern. The pattern measurement apparatus includes: irradiation unit for irradiating a sample with an electron beam; first electron detector and second electron detector arranged with an optical axis of the electron beam in between; image processor for generating image data of the pattern; line profile generator for generating a line profile of the pattern; and controller for causing the image processor to generate the image data of the pattern on the basis of an amount of electrons corresponding to the difference between a signal detected by the first electron detector and a signal detected by the second electron detector.

16 Claims, 11 Drawing Sheets

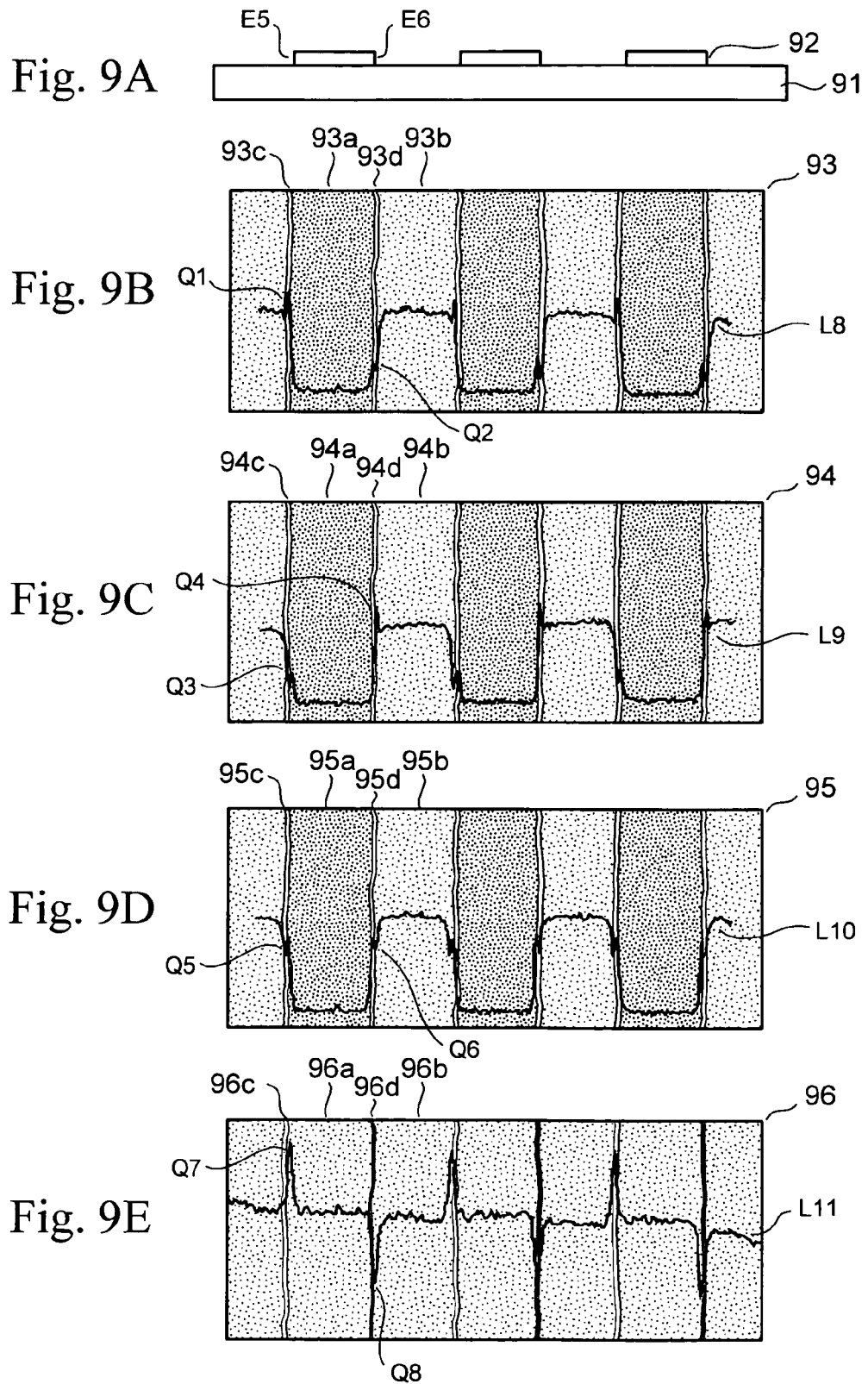

Fig. 10B

| film thickness H2 | edge width | |
|---|---|---|
| | 80° | 85° |
| 5nm | 0.88nm | 0.44nm |
| 10nm | 1.76nm | 0.87nm |

PATTERN MEASURING APPARATUS AND PATTERN MEASURING METHOD

CROSS-REFERENCE TO RELATED APPLICATIONS

This application is based on and claims priority of Japanese Patent Application No. 2010-178310 filed on Aug. 9, 2010, the entire contents of which are incorporated herein by reference.

BACKGROUND OF THE INVENTION

1. Field of the Invention

The present invention relates to a pattern measuring apparatus and a pattern measuring method which use a charged particle beam, and relates particularly to a pattern measuring apparatus and a pattern measuring method which can distinguish lines and spaces from one another in a line and space pattern in which the pattern width and spacing are equal.

2. Description of the Related Art

Measurement using a scanning electron microscope is performed as a method of measuring a line width of a pattern. The scanning electron microscope irradiates and scans a region within an electron beam scanning area with incident electrons, obtains secondary electrons emitted from a sample by using a scintillator, converts the amount of the obtained electrons into luminance and display an image on a display device.

The management of the characteristics of a semiconductor device by using such a scanning electron microscope generally includes a work of checking whether a pattern is formed to have the line width within a design standard. The management of the line width of the pattern is performed in the following procedures. A predetermined area of the pattern formed on a photomask is displayed on a display. Thereafter, an electron beam is aimed at a measurement point within the displayed area, and the measurement point is irradiated with the electron beam. Then, a waveform of luminance distribution is obtained based on secondary electrons reflected from the measurement point. Subsequently, the width of a portion where the waveform of the luminance distribution is at a high level is determined as a line width. It is determined whether the line width is within an allowable margin of error. If the line width is within the allowable margin of error, the processing proceeds to the next step. If the line width is not within the allowable margin of error, the processing returns to a step of pattern formation processing.

As described above, the measurement of the line width of the pattern is important in a manufacturing process of the semiconductor device, and various methods are proposed to accurately measure the line width.

Generally, a position at which the inclination of the luminance corresponding to the amount of secondary electrons is the largest is set as an edge position of the pattern. Meanwhile, Japanese Laid-open Patent Publication No. 05-296754 discloses such an edge detection method that a position at which a secondary electron signal takes the minimum value is considered as the edge position.

Moreover, Japanese Laid-open Patent Publication No. 2005-195361 discloses a method in which luminance information of a line and space pattern is subjected to primary differentiation, and average line width and space width are calculated from an auto-correlation value between an original image and an image shifted in an x direction.

Meanwhile, if a line pattern and a space pattern have almost the same width, it is sometimes difficult to judge whether a region between two edges is the line pattern or the space pattern even if the edges are detected. For example, as shown in FIG. 1A, since the tone of a line pattern 103a is generally higher than the tone of a space pattern 102a, the pattern 103a with a high tone between edges 101 can be judged as a line pattern.

However, depending on the material and film thickness of the pattern, there may be no difference in tone between the line pattern 103b and the space pattern 102b as shown in FIG. 1B, or the tones may be reversed in the line pattern 103b and the space pattern 102c as shown in FIG. 1C. In such cases, the portion between the edges 101 may be erroneously judged as being a line pattern or a space pattern.

Japanese Laid-open Patent Publication 2007-292732 describes a technique of identifying whether a portion is a line pattern or a space pattern in a line and space pattern in which a line width and a space width are formed to be almost equal.

In the technique of Japanese Laid-open Patent Publication 2007-292732, detection can be made on whether an edge of a line pattern is rising or falling on the basis of a secondary differentiation profile of a line profile, in the case where a line pattern and a space pattern have almost the same width.

Specifically, the line profile is calculated from a SEM image of a pattern, and processing of obtaining the secondary differentiation profile from the line profile is performed, and determination of whether the edge is rising or falling is made based on the peak position and peak value of the secondary differentiation profile near the edge of the pattern.

However, when the peak value of the secondary differentiation profile is not clearly detected, it is difficult to accurately judge whether the edge is rising or falling.

SUMMARY OF THE INVENTION

The present invention has been made in view of the technical problem describe above. An object of the present invention is to provide a pattern measuring apparatus and a pattern measuring method capable of accurately determining a recess and a protrusion of a measurement target portion, and easily distinguishing a line pattern and a space pattern from one another, without being affected by the luminance of a pattern.

The problem describe above is solved by a pattern measuring apparatus including: display unit; irradiation unit for irradiating a sample with a charged particle beam; a first electron detector and a second electron detector for detecting an amount of electrons emitted from the sample having a pattern by the irradiation with the charged particle beam, the first electron detector and the second electron detector arranged with an optical axis of the charged particle beam in between; an image processor generating an image data of the pattern on the basis of the amount of electrons; and a controller calculating a subtracted signal between a signal detected by the first electron detector and a signal detected by the second electron detector, causing the image processor to generate the image data of the pattern on the basis of an amount of electrons corresponding to the subtracted signal, and displaying an image corresponding to the image data on a screen of the display unit.

The pattern measuring apparatus according to this aspect may further include a line profile generator generating a line profile of the pattern formed on the sample, on the basis of the amounts of electrons detected by the first and second electron detector, wherein if the first electron detector is provided on a left side of the pattern and the second electron detector is provided on a right side of the pattern, the controller determines that a positive peak position of the line profile generated by the line profile generator and corresponding to the subtracted signal is rising of an edge of the pattern, and that a negative peak position of the line profile is falling of an edge of the pattern. In addition, if the line profile corresponding to the subtracted signal has a step at a position, near the position of any one of the peaks in the course to the peak, the controller sets a width of a mountain on a side of the step closer to the peak, as an edge width. Furthermore, the controller sets a distance from an endpoint position of the step on the peak side to a position on an opposite side of the peak to the endpoint position as the width of the mountain, the position indicating the same signal value as that at the endpoint position. Moreover, the controller may obtain a differentiation profile by differentiating the line profile, and set a distance from a position of a maximum value to a position of a minimum value as the width of the mountain, the maximum value and the minimum value being those of the differentiation profile in a region at the peak side of the step.

In addition, in the pattern measuring apparatus according to this aspect, the controller may calculate an inclination angle of each of the edges of the pattern on the basis of the edge width and a height of the pattern. Moreover, for the edge width from a position X1 to a position X2 (>X1) detected based on a positive peak in the line profile and for the edge width from a position X3 (>X2) to a position X4 (>X3) detected based on a negative peak adjacent to the positive peak, the controller may calculate a distance from the position X1 to the position X4 as a bottom width of the pattern. The controller may assume that a rising edge and a falling edge of the pattern have the same width at least if an edge angle of the pattern is substantially equal to a right angle or a film thickness of the pattern is smaller than a predetermined thickness, calculate the distance from the positive peak position to the negative peak position of the line profile, and set a value obtained by adding an edge width detected in advance based on the film thickness of the pattern and the inclined angle of the edge to the distance, as a line width of the pattern.

In addition, the problem described above is solved by a pattern measuring method in which a sample is irradiated with a charged particle beam to measure a pattern formed on the sample on the basis of an amount of electrons emitted from the sample, the pattern measuring method including the steps of: obtaining a first SEM image of the pattern formed on the sample on the basis of a first amount of electrons detected by first electron detector among the first, electron detector and second electron detector arranged with an optical axis of the charged particle beam in between; obtaining a second SEM image of the pattern formed on the sample on the basis of a second amount of electrons detected by the second electron detector; obtaining a third SEM image of the pattern on the basis of a third amount of electrons corresponding to subtraction of the second amount of electrons from the first amount of electrons; and displaying the third SEM image on a screen of display unit.

The pattern measuring method according to this aspect may further include the steps of: generating a line profile of the pattern on the basis of the third amount of electrons; and if the first electron detector is provided on a left side of the pattern and the second electron detector is provided on a right side of the pattern, determining that a positive peak position of the line profile is rising of an edge of the pattern and that a negative peak position of the line profile is falling of an edge of the pattern. Furthermore, the pattern measuring method according to this aspect may further include the step of, if the line profile has a step at a position near the position of any one of the peaks in the course to the peak, setting a width of a mountain on a side of the step closer to the peak, as an edge width. In addition, in the step of setting the width of the mountain on side of the step closer to the peak as the edge width, a distance from an endpoint position of the step on the peak side to a position on an opposite side of the peak to the endpoint position may be set as the width of the mountain, the position indicating the same signal value as that at the endpoint position. Moreover, the step of setting the width of the mountain on a side of the step closer to the peak, as the edge width may include the steps of: obtaining a differentiation profile by differentiating the line profile; and setting a distance from a position of a maximum value to a position of a minimum value as the width of the mountain, the maximum value and the minimum value being those of the differentiation profile in a region on a side of the step closer to the peak.

In addition, the pattern measuring method according to this aspect may further include the step of calculating an inclination angle of each of the edges of the pattern on the basis of the edge width and a height of the pattern. The pattern measuring method according to this aspect may further include the steps of: detecting a positive peak and a negative peak adjacent to the positive peak from the line profile; calculating an edge width from a position X1 to a position X2 (>X1) detected based on the positive peak; calculating an edge width from a position X3 (>X2) to a position X4 (>X3) detected based on the negative peak; and calculating a distance from the position X1 to the position X4 as a bottom width of the pattern. Furthermore, the pattern measuring method according to this aspect may further include the steps of: calculating the distance from the positive peak position to the negative peak position of the line profile, if an edge angle of the pattern is substantially equal to a right angle or a film thickness of the pattern is smaller than a predetermined thickness at least, while assuming that the rising edge and the falling edge of the pattern have the same width; and calculating a line width of the pattern by adding an edge width detected in advance based on the film thickness of the pattern and the inclined angle of the edge to the distance.

In the present invention, the pattern measuring apparatus includes the plurality of electron detectors, calculates the difference between the amount of electrons detected by the electron detector arranged on one edge side of the pattern and the amount of electrons detected by the electron detector arranged on another edge side, and forms the SEM image of the pattern based on the amount of electrons corresponding to the difference. Thus, the luminance of the edge portion is emphasized, and a region in which the pattern is formed and a region in which no pattern is formed can be displayed to be clearly distinguished from one another.

Moreover, the line profile is generated based on the amount of electrons corresponding to the difference obtained by subtracting the amount of electrons detected by the electron detector arranged on the right side of the pattern from the amount of electrons detected by the electron detector arranged on the left side of the pattern. In this line profile, the positive peak position corresponds to the rising of the edge of the pattern, and the negative peak position corresponds to the falling of the edge of the pattern. Thus, it can be easily determined whether an edge of the pattern is rising or falling, without performing primary differentiation or secondary differentiation of the line profile.

BRIEF DESCRIPTION OF THE DRAWINGS

FIGS. 9A to 9E include views showing the SEM images and line profiles of a thin-film mask.

FIGS. 10A to 10C are views for explaining compensation using a measured value and an edge width.

DESCRIPTION OF THE EMBODIMENT

An embodiment of the present invention is described below with reference to the drawings.

First, descriptions are given of the configuration of a scanning electron microscope used as a pattern measuring apparatus. Thereafter, descriptions are given of a general method of measuring a line width of a pattern. Then, descriptions are given of generation of a SEM image and measurement of a pattern by using a plurality of electron detectors.

(Configuration of Scanning Electron Microscope)

Figure 1A:
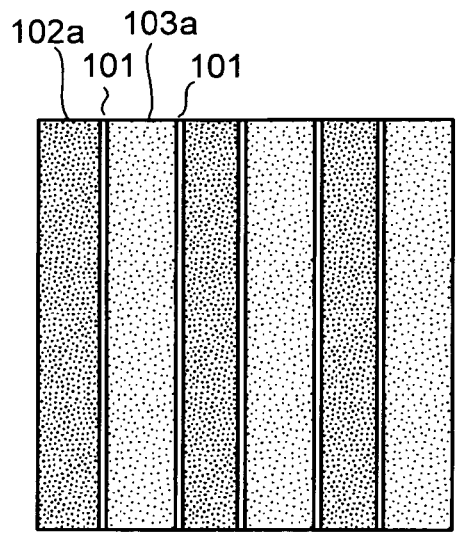
FIGS. 1A to 1C are views each showing an example of a SEM image of a line and space pattern.
Figure 1B:
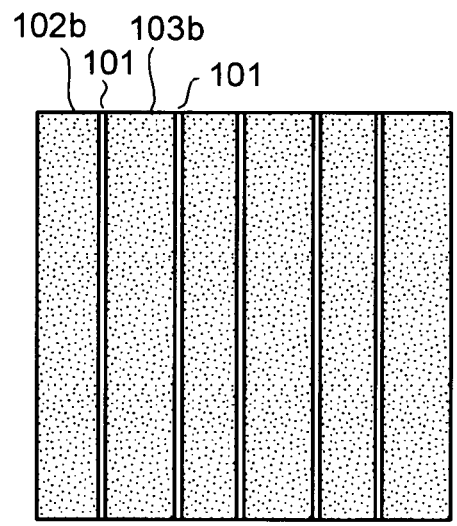
Figure 1C:
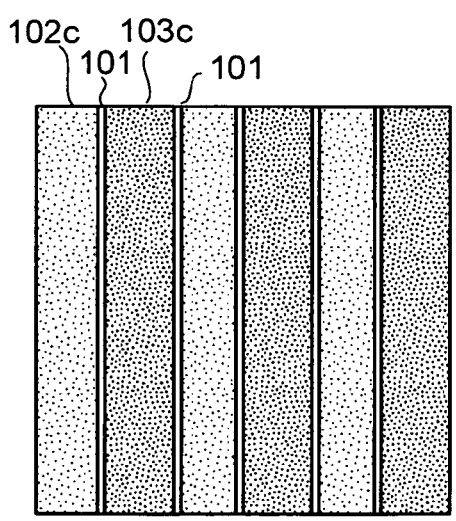
Figure 2:
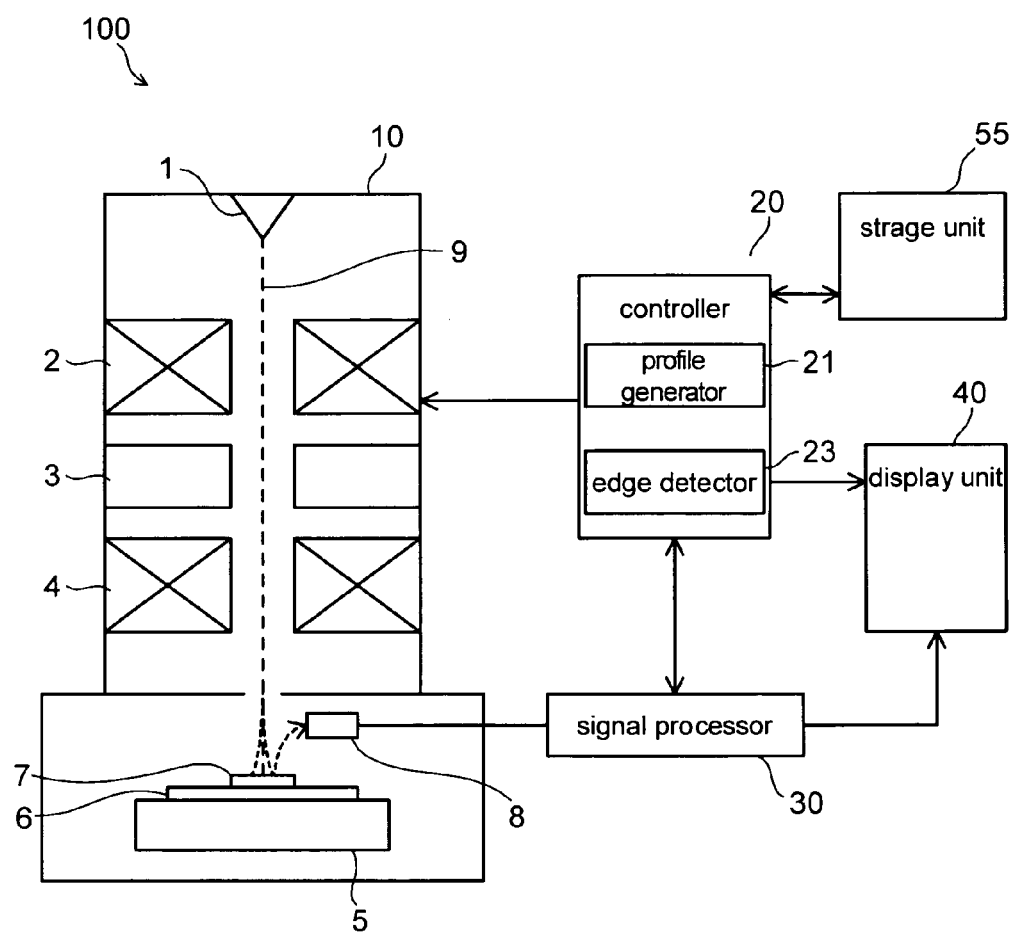
FIG. 2 is a configuration diagram of a scanning electron microscope used in an embodiment of the present invention.

FIG. 2 is a configuration diagram of a scanning electron microscope of the embodiment.

This scanning electron microscope 100 is roughly divided into an electron scanner 10, a signal processor 30, an image displaying unit 40, a storage unit 55, and a controller 20 controlling the electron scanner 10, the signal processor 30, the image displaying unit 40, and the storage unit 55. The controller 20 includes a profile generator 21 and an edge detector 23.

The electron scanner 10 includes an electron gun 1, a condensing lens 2, a deflecting coil 3, an objective lens 4, a moveable stage 5, and a sample holder 6.

Charged particles 9 emitted from the electron gun 1 pass through the condensing lens 2, the deflecting coil 3, and the objective lens 4. A sample 7 on the moveable stage 5 is then irradiated with the charged particles 9.

Secondary electrons emitted from the sample 7 irradiated with the charged particles 9 (primary electron beam) are detected by an electron detector 8 including a scintillator and the like. The amount of electrons of the detected secondary electrons is converted into a digital amount by an AD converter of the signal processor 30, and is stored in the storage unit 55 as image data. The image data are converted into luminance signals and are displayed in the image displaying unit 40.

The image data are arranged in a two-dimensional array in the same arrangement as the corresponding scanning positions of the primary electron beam on the sample 7. Thus, a two-dimensional digital image is obtained. Each of pixels in the two-dimensional digital image shows luminance data in an information amount of eight bits.

The electron deflecting amount of the deflecting coil 3 and the image scan amount of the image displaying unit 40 are controlled by the controller 20. Moreover, a program for executing line width measurement is stored in the controller 20.

The profile generator 21 generates a line profile showing luminance signals of SEM image data within a designated area. The line profile shows luminance signals corresponding to the amount of secondary electrons, and is assumed to reflect the cross-sectional shape of a measured pattern.

The edge detector 23 detects edges of the pattern on the basis of the data of the line profile.

(General Measurement of Pattern Size by Utilizing SEM Image)

Figure 3A:
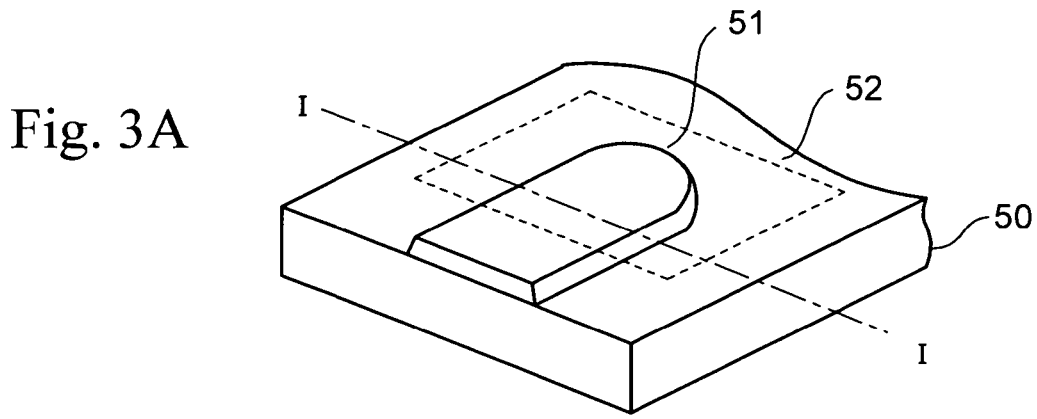
FIGS. 3A to 3D are views for explaining an electron image and profiles obtained by a signal processor.

Next, descriptions are given of measurement of a pattern size by utilizing the SEM image including detected edges of a pattern of a sample shown in FIG. 3A, the measurement performed using the scanning electron microscope 100 shown in FIG. 2.

As shown in FIG. 3A, a sample with a wiring pattern 51 formed on a photomask substrate 50 is used as the sample 7. A portion of the sample 7 has a flat shape as shown in FIG. 3A. Here, a portion surrounded by a broken line 52 show the observation region of the scanning electron microscope 100.

Figure 3B:
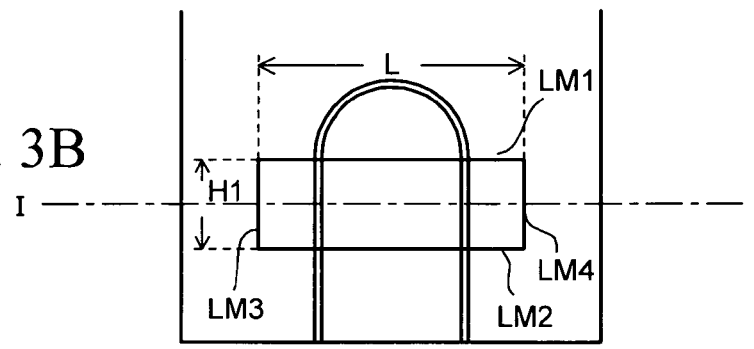

FIG. 3B shows an example of an SEM image which is displayed in the following way. The electron detector 8 detects the amount of secondary electrons and the like obtained by scanning the sample shown in FIG. 3A with the electron beam. Then, the detected amount of electrons is converted into luminance signals. Subsequently, the scanning of the electron beam is synchronized with the scanning of a CRT of the displaying device (image displaying unit 40) and the SEM image is displayed.

A measurement area is designated in the SEM image shown in FIG. 3B, and the SEM image of the measurement area is extracted. The measurement area is, for example, a region having a width H1 of 400 pixels and a length of L. An operator designates the region by using an upper line marker LM1, a lower line marker LM2, a left line marker LM3, and a right line maker LM4.

The measurement area is divided in a direction perpendicular to the H1 direction, and the line profile corresponding to a luminance distribution is obtained for each of divided regions from the extracted SEM image pixel data. In the case of obtaining the line profile, noise components can be reduced by performing smoothing processing in the length L direction, for example, at a width of three pixels.

Figure 3C:
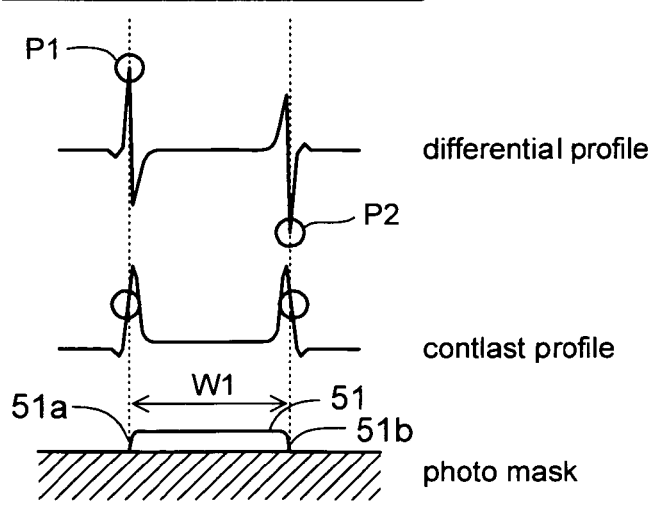

FIG. 3C is a view showing the line profile corresponding to the amount of secondary electrons emitted from the sample, which is obtained when the sample is irradiated with the electron beam along the I-I line of FIG. 3A. As shown in FIG. 3C, the line profile (contrast profile) changes sharply at edge portions of the pattern. Generally, the positions of sharp changes are obtained by differentiating the line profile and then finding the maximum peak and the minimum peak of the differentiated signal.

Figure 3D:
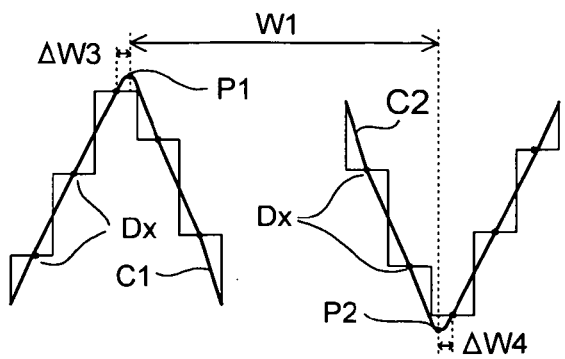

Furthermore, as shown in FIG. 3D, differentiation waveforms C1, C2 are obtained from a plurality of differentiation signals Dx before and after the peaks, by performing complementation between each of adjacent pixels. Thus, the peak positions of the first peak P1 and the second peak P2 are calculated with a resolution of 1/100. The width W1 of the line pattern is obtained as a distance between the first peak P1 and the second peak P2.

The processing described above is performed for each of the divided regions, and the average value of the pattern widths calculated in the respective regions is set as a measured length value. Thus, the width W1 of the line pattern can be obtained more accurately.

(Generation of SEM Image and Measurement of Pattern by Using Plurality of Electron Detectors)

Descriptions are given below of obtainment of the SEM image of the pattern formed on the sample and measurement processing of the pattern by using a plurality of electron detectors.

Figure 4A:
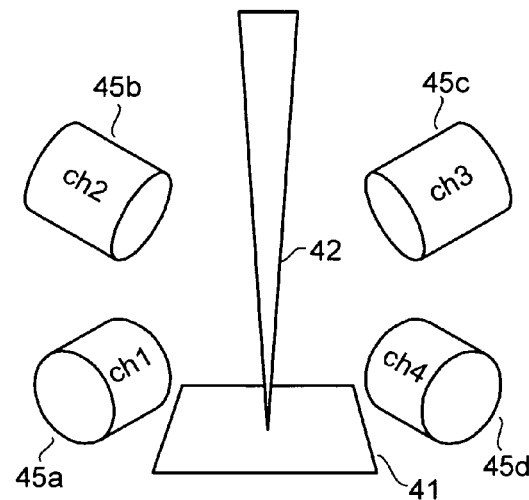
FIGS. 4A and 4B are views for explaining the principle of how a recess and a protrusion of a pattern are highlighted by using a plurality of electron detectors.

FIG. 4A is an overall schematic diagram showing an arrangement of electron detectors. As shown in FIG. 4A, electron detectors 45a to 45d are arranged symmetrically around the optical axis of a charged particle beam 42. The electron detectors 45a to 45d catch the secondary electrons generated when the sample placed on a sample stage 41 is irradiated with the charged particle beam, and send the signal processer 30 the amounts of electrons at their installed positions as signals of ch1 to ch4, respectively.

Generally, all of the signals of ch1 to ch4 of the respective electron detectors 45a to 45d arranged as described above are added to each other to calculate the amount of secondary electrons. Then, the SEM image is generated or an edge position is detected based on the value of the amount of secondary electrons.

In the embodiment, the SEM image is generated based on subtracted data obtained by subtracting the amount of secondary electrons detected by electron detectors provided on one edge side of a line pattern from the amount of secondary electrons detected by electron detectors provided on another edge side of the line pattern. In the SEM image thus generated, the edge position is shown more clearly than that in the SEM image generated based on the amount of electrons obtained by adding all the detected amounts of electrons together. Thus, recesses and protrusions of the pattern can be clearly identified.

Figure 4B:
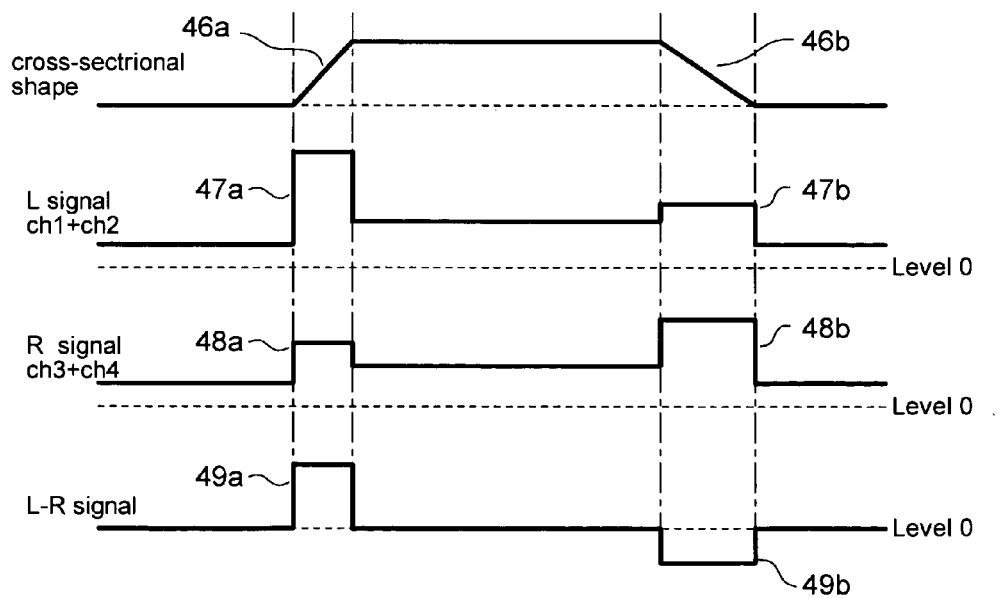

FIG. 4B is a view for explaining the principle of why recesses and protrusions of the pattern are highlighted. The pattern includes a rising inclined edge 46a and a falling inclined edge 46b as shown in a cross-sectional shape.

A signal obtained by adding the signals detected by the detectors 45a and 45b arranged on the left side of the pattern is referred to as an L signal, and a signal obtained by adding the signals detected by the detectors 45c and 45d arranged on the right side of the pattern is referred to as an R signal.

A large number of secondary electrons generated at the rising inclined edge 46a are caught by the detectors (45a, 45b) arranged on the left side, and a large number of secondary electrons generated at the falling inclined edge 46b are caught by the detectors (45c, 45d) arranged on the right side.

Since many of the secondary electrons generated at the rising inclined edge 46a head toward the detectors (45a, 45b) arranged on the left side, an L signal portion 47a corresponding to the edge 46a has a large value. On the other hand, since only few of the secondary electrons head toward the detectors (45c, 45d) arranged on the right side, an R signal portion 48a has a smaller value than the L signal portion 47a. Similarly, in the falling inclined edge 46b, the value of an R signal portion 48b corresponding to the edge 46b is larger than the value of an L signal portion 47b.

Taking the difference between the L signal and the R signal causes the signal amount in flat regions to be close to zero, the amount of electrons at the rising inclined edge 46a to be emphasized to the positive side as shown in an L−R signal portion 49a, and the amount of electrons at the falling inclined edge 46b to be emphasized to the negative side as shown in an L−R signal portion 49b.

Figure 5A:
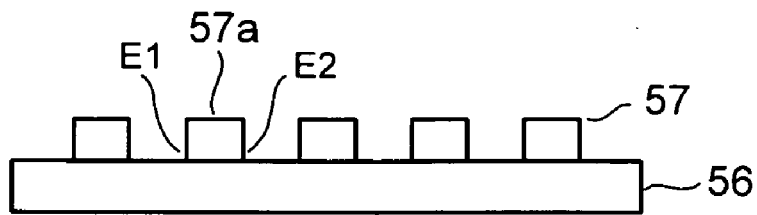
FIGS. 5A to 5C include views showing the SEM images and line profiles of a COG mask.
Figure 5B:
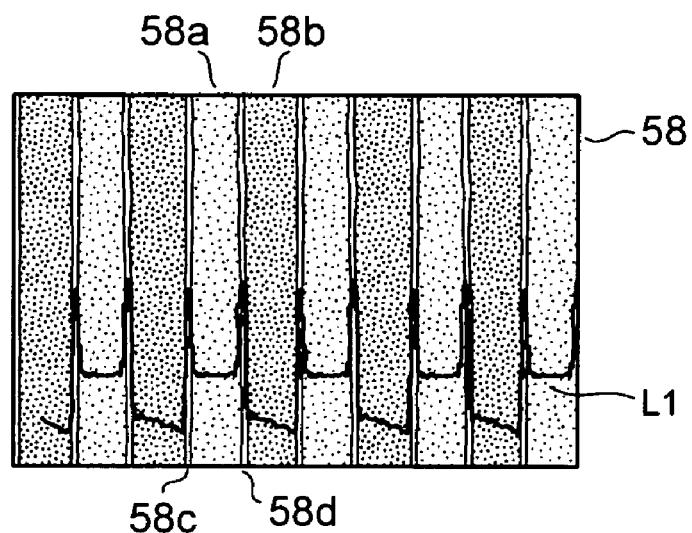
Figure 5C:
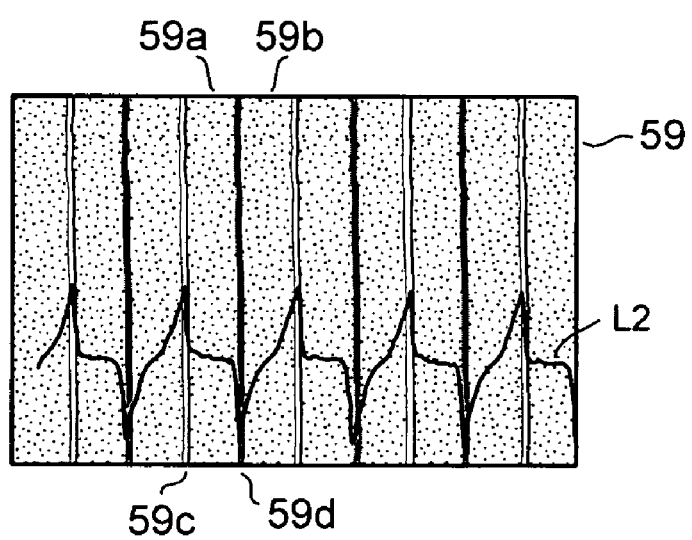

FIGS. 5A to 5C include views showing the SEM images and the line profiles of a COG mask. FIG. 5A shows a chrome pattern 57 formed on a glass substrate 56. FIG. 5B shows a SEM image 58 of the COG mask of FIG. 5A which is generated based on a signal amount obtained by adding the signal amount detected by the detectors (45a, 45b) on the left side to the signal amount detected by the detectors (45c, 45d) on the right side. As shown in the SEM image 58, an image portion 58a in which the pattern 57a is formed is displayed brighter than an image portion 58b in which no pattern is formed. As shown in a line profile L1, the signal amount is larger at edge sections than at other portions.

FIG. 5C shows a SEM image 59 of the COG mask of FIG. 5A which is generated based on a signal amount obtained by subtracting the signal amount detected by the detectors (45c, 45d) on the right side from the signal amount detected by the detectors (45a, 45b) on the left side. As shown in the SEM image 59, a SEM image portion 59c corresponding to a rising edge E1 of the pattern is highlighted in white, and a SEM image portion 59d corresponding to a falling edge E2 of the pattern is highlighted in black. Moreover, a line profile L2 has a positive peak at a rising edge portion and a negative peak at a falling edge portion. Thus, a SEM image portion 59a in which the pattern is formed can be clearly distinguished from a SEM image portion 59b in which no pattern is formed.

Figure 6A:
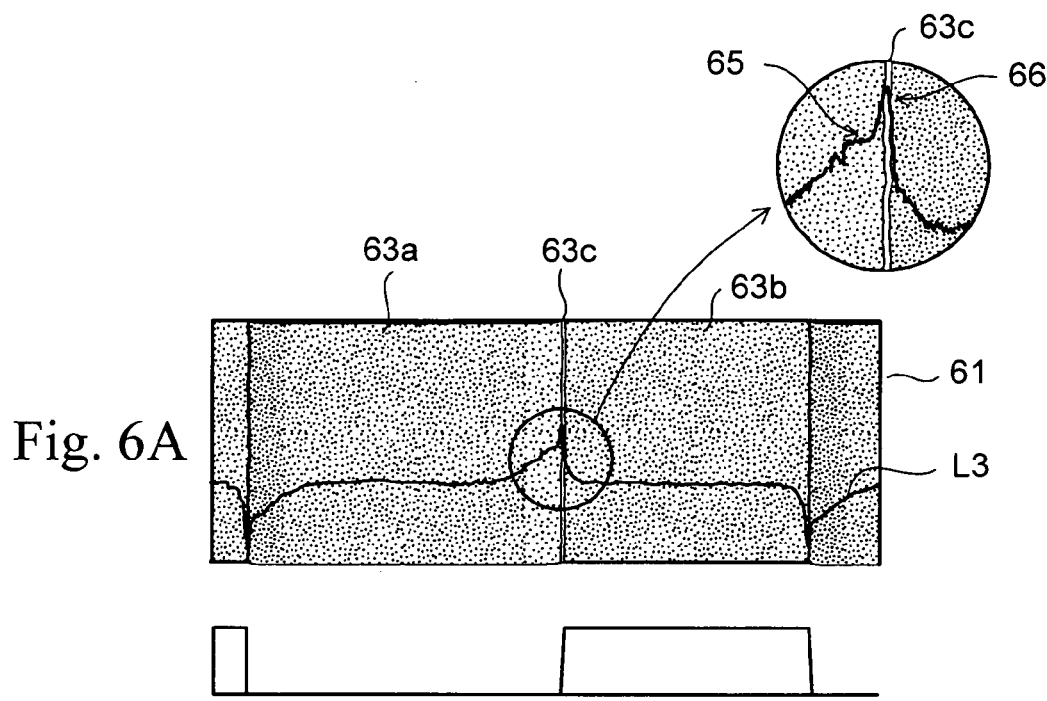
FIG. 6A is view showing the SEM image and line profile of a pattern with inclined edges.
Figure 6B:
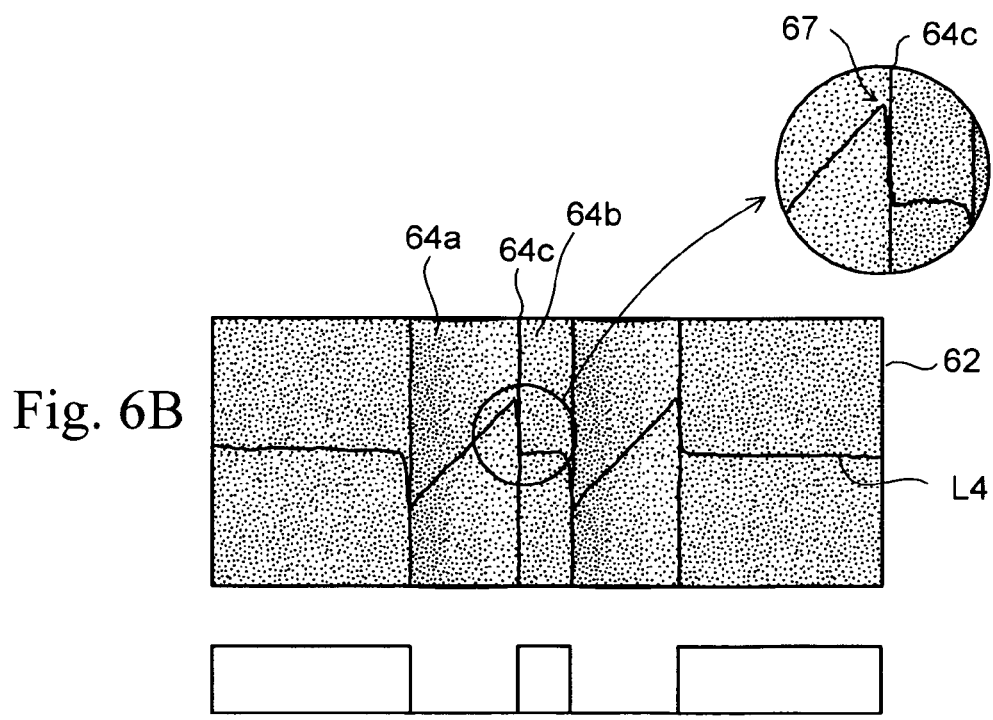
FIG. 6B is a view showing the SEM image and line profile of a pattern with non-inclined edges.
Figure 7:
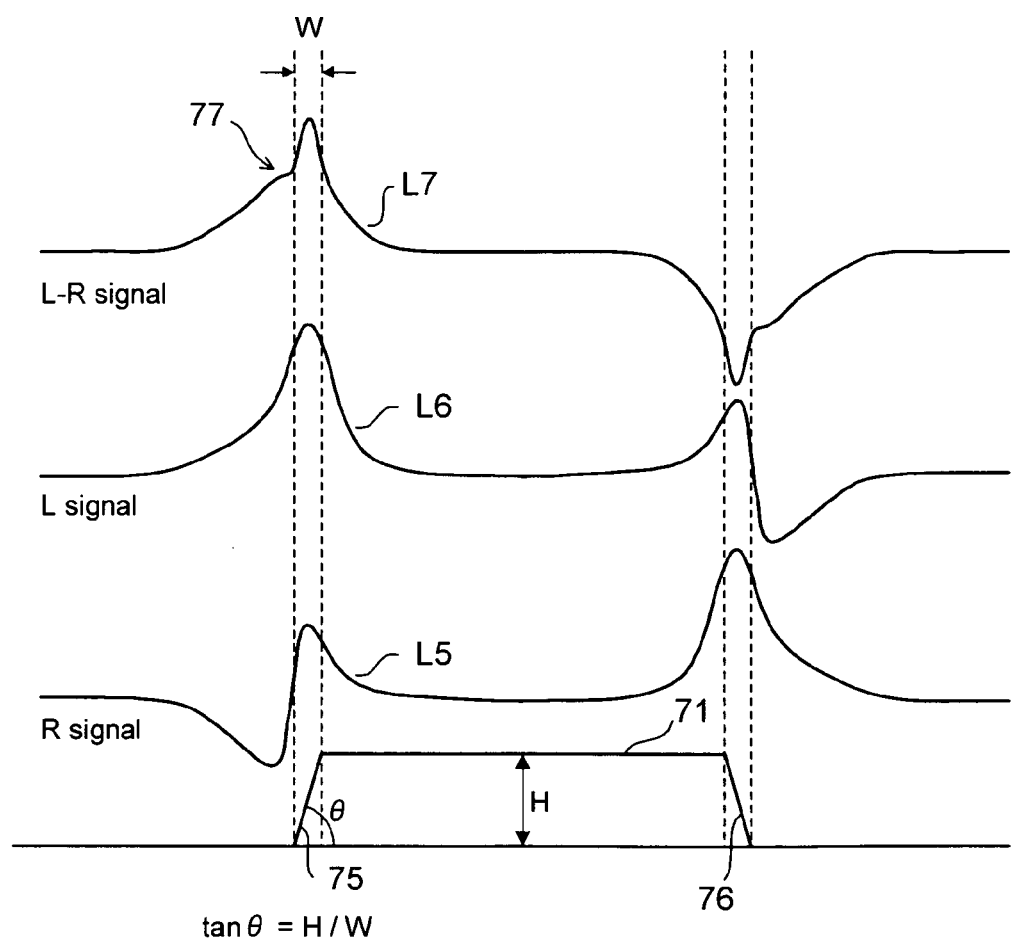
FIG. 7 is a view for explaining calculation of an edge angle.

Next, descriptions are given of detection of an edge width and measurement of an edge angle with reference to FIG. 6A to FIG. 7. FIG. 6A is a view showing the SEM image and the line profile of a pattern with inclined edges, and FIG. 6B is a view showing the SEM image and the line profile of a pattern with non-inclined edges.

FIG. 6A shows a SEM image 61 of a pattern having a film thickness of 70 nm and having inclined edges. A SEM image portion 63a corresponds to a space, and a SEM image portion 63b corresponds to a pattern. Moreover, a SEM image portion 63c corresponding to a rising edge of the pattern is displayed in white. When we take a look at an edge section of a line profile L3, a step 65 exists on a side of a positive peak 66 closer to the space, at a position in the course to the peak 66, and the peak 66 with a width of several nm exists in a protruding manner.

Meanwhile, FIG. 6B shows a SEM image 62 in which the edge angle is 90° with respect to a pattern. A SEM image portion 64a corresponds to a space, and a SEM image portion 64b corresponds to a pattern. Moreover, a SEM image portion 64c corresponding to a rising edge of the pattern has the highest luminance. When we take a look at an edge section of a line profile L4, unlike in FIG. 6A, the inclination of the line profile L4 on a side of a positive peak 67 closer to the space is constant, and there is no step.

As described above, a width smaller than a beam diameter normally does not appear in the line profile of the SEM image. However, generating a difference image of L−R allows the protruding peak to be observed in which information on the edge width appears clearly. Accordingly, the width of the edge portion can be detected by measuring the width of the peak portion.

Moreover, if the film thickness of the pattern is already known, the angle of an edge sidewall can be calculated from the width of the edge section.

FIG. 7 is a view for explaining calculation of the edge angle. It is assumed that a film thickness H of a pattern 71 to be measured is known in advance.

In a line profile L5 generated based on an R signal detected by the detectors farther from an edge 75 of the pattern 71, the signal value of the line profile L5 decreases on a side of a rising pattern closer to an space, and the signal value thereof in an edge section is larger than that in a flat section. This is because the edge 75 creates a shadow.

In a line profile L6 generated based on an L signal detected by the detectors closer to the edge 75 of the pattern 71, the signal value of the line profile L6 rises on a side of a rising pattern closer to an space, and the signal value thereof in an edge section is larger than that of the R signal. This is because the detectors are located on a reflection side of the edge 75.

In a line profile L7 based on a subtracted signal (L−R signal) of the L signal and the R signal, a step 77 appears on a side of the edge 75 closer to the space, and a protruding peak which corresponds to the edge 75 is formed.

If the edge has a width, in the R signal, the peak of the line profile L5 appears in a center portion of the edge, and a portion in which the change rate of the line profile L5 is positive exists on a side of the edge section closer to the space. The step 77 appears in the L−R signal since there is a section in which the change rate in this positive-change-rate portion becomes equal to the change rate of the line profile L6 of the L signal.

Meanwhile, if the edge angle is 90°, the width of the edge section is zero. Thus, it is assumed that no step appears in the L−R signal.

Accordingly, in the L−R signal, if there is a step at a position near the peak position in the course to the peak, the edge width is considered to be the width of a mountain on a side of the step closer to the peak, for example, a distance W from an endpoint position (position of a point at which the change rate of the line profile changes abruptly) to a position on an opposite side of the peak to the endpoint position, the position indicating the same signal value as that at the endpoint position.

Moreover, if the line profile is differentiated and the differentiated profile is obtained, the edge width may be determined as follows. The maximum value and the minimum value a side of the step closer to the peak are obtained from the differentiated profile, and a distance from the position of the maximum value and the position of the minimum value is set as the edge width.

By using the thus detected edge width W and the height H of the pattern, the edge angle θ can be calculated from tan θ=H/W.

Moreover, the width of the pattern 71 can be calculated from a distance between the left edge position of the width of the edge 75 detected in the left-side area of the pattern and a right edge position of the width of an edge 76 detected in the right-side area of the pattern. This measurement method allows the dimensions of the pattern to be measured independently of the electron beam diameter Next, descriptions are given of a method of measuring the pattern width in a thin-film mask in which a pattern with a height of 10 nm or less is formed.

Figure 8:
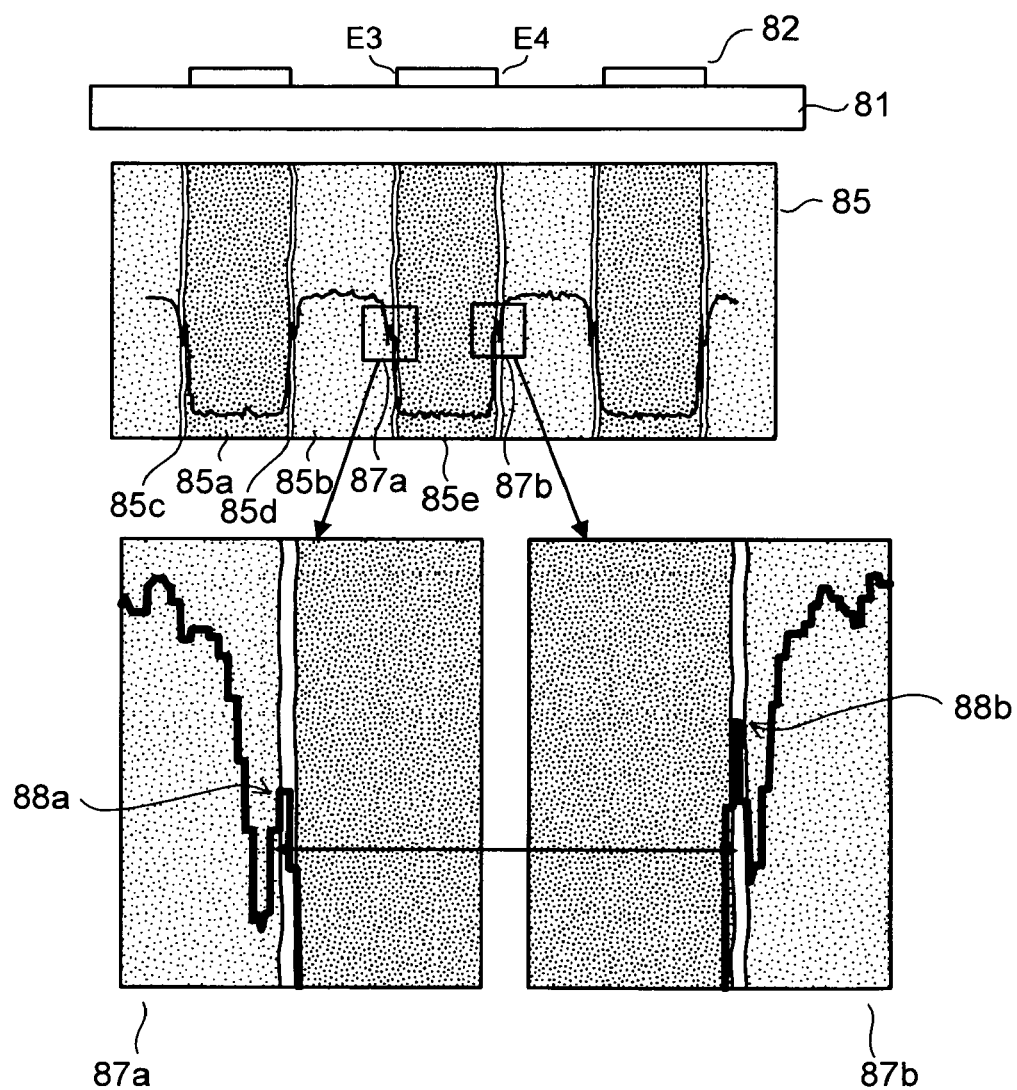
FIG. 8 is a view for explaining a line width measurement of a pattern in a thin-film mask.

FIG. 8 shows processing performed when the SEM image of a pattern is obtained by a conventional electron detector. As shown in FIG. 8, the luminance of a line portion 85a is lower than the luminance of a space portion 85b. In the thin-film pattern, the luminance signal of an edge portion 85c is extremely small. Thus, it is difficult to determine from the profile whether an edge is rising or falling. Furthermore, since luminance information changes depending on the material and film thickness of the pattern, it is extremely difficult to distinguish lines from spaces in a pattern in which the lines and the spaces are arranged at equal intervals.

Moreover, as shown in FIG. 8, although the maximum value and the minimum values appear at each of edge positions (E3, E4) of the line profile, accurate detection of the edge positions is difficult for the following reason. The position of the edge E3 on the left side is at a rising edge position on the left side of a maximum value 88a of a profile portion 87a, and the position of the edge E4 on the right side is at a falling edge position on the right of a maximum value 88b of a profile portion 87b, and the luminance of the space portion 85b is higher than the maximum values (88a, 88b) of the profile portions.

FIGS. 9A to 9E include the SEM images of a thin-film mask generated based on the amounts of electrons detected by the electron detectors 45a to 45d.

FIG. 9A shows an example of the thin-film mask in which a thin-film pattern 92 is formed on a substrate 91. FIG. 9B shows a SEM image 93 generated based on the amount of electrons detected by the electron detectors 45a, 45b on the left side of the pattern 92, and a line profile L8. As shown in the SEM image 93 of FIG. 9B, SEM image portions 93c, 93d respectively corresponding to edge positions (E5, E6) of the pattern have high luminance and thus are displayed in white. Moreover, a SEM image portion 93a in which the pattern is formed is displayed to be darker than a SEM image portion 93b in which no pattern is formed.

Furthermore, as shown in the line profile L8, the amount of electrons of the portion 93b in which no pattern is formed is higher than that of the portion 93a in which the pattern is formed. Moreover, the value of the line profile L8 is large at the edge positions (E5, E6) of the pattern. Specifically, the value of a line profile portion Q1 corresponding to the left edge position E5 is larger than the value of a line profile portion Q2 corresponding to the right edge position E6.

FIG. 9C shows a SEM image 94 generated based on the amount of electrons detected by the electron detectors 45c, 45d on the right side of the pattern 92, and a line profile L9. As shown in the SEM image 94 of FIG. 9C, SEM image portions 94c, 94d respectively corresponding to edge positions (E5, E6) of the pattern have high luminance and thus are displayed in white. Moreover, a SEM image portion 94a in which the pattern is formed is displayed to be darker than a SEM image portion 94b in which no pattern is formed.

Furthermore, as shown in the line profile L9, the amount of electrons of the portion 94b in which no pattern is formed is higher than that of the portion 94a in which the pattern is formed. Moreover, the value of the line profile L9 is large at the edge positions (E5, E6) of the pattern. Specifically, the value of a line profile portion Q3 corresponding to the left edge position E5 is smaller than the value of a line profile portion Q4 corresponding to the right edge position E6.

FIG. 9D shows a SEM image 95 generated based on the amount of electrons obtained by adding together the amount of electrons detected by the electron detectors 45a, 45b on the left side and the amount of electrons detected by the electron detectors 45c, 45d on the right side, and line profile L10. As shown in the SEM image 95 of FIG. 9D, SEM image portions 95c, 95d respectively corresponding to edge positions (E5, E6) of the pattern have high luminance and thus are displayed in white. Moreover, a SEM image portion 95a in which the pattern is formed is displayed to be darker than a SEM image portion 95b in which no pattern is formed.

Furthermore, as shown in the line profile L10, the amount of electrons of the portion 95b in which no pattern is formed is higher than that of the portion 95a in which the pattern is formed. Moreover, the value of the line profile is large at the edge positions (E5, E6) of the pattern. Specifically, the value of a line profile portion Q5 corresponding to the left edge position E5 and the value of a line profile portion Q6 corresponding to the right edge position E6 are almost the same.

FIG. 9E shows a SEM image 96 generated based on the amount of electrons obtained by subtracting the amount of electrons detected by the electron detectors 45c, 45d on the right side from the amount of electrons detected by the electron detectors 45a, 45b on the left side, and line profile L11. Note that, each of pixels of the image is shown in luminance data having an information amount of 8 bits, and is set such that a pixel value dose not take a negative value when the difference is taken between the amounts of electrons detected by the electron detectors on the right side and the left side, by adding a predetermined value, for example, 128 to the pixel value.

As shown in the SEM image 96 of FIG. 9E, a SEM image portion 96c corresponding to the rising edge position E5 of the pattern is displayed in white, and a SEM image portion 96d corresponding to the falling edge position E6 of the pattern is displayed in black. Moreover, a SEM image portion 96a in which the pattern is formed is displayed in almost the same color as a SEM image portion 96b in which no pattern is formed.

Furthermore, as shown in the line profile L11, the portion 96b in which no pattern is formed and the portion 96a in which the pattern is formed have almost the same amount of electrons.

In addition, a line profile portion Q7 corresponding to the rising edge position E5 on the left side of the pattern takes a positive peak value, and a line profile portion Q8 corresponding to the falling edge position E6 on the right side of the pattern takes a negative peak value.

As described above, the signal amount at each of the edge positions E5, E6 is emphasized by subtracting the amount of electrons detected by the electron detectors 45c, 45d on the right side of the pattern from the amount of electrons detected by the electron detectors 45a, 45b on the left side. Thus, the rising edge and the falling edge can be easily distinguished from one another. Hence, the region in which the pattern is formed and the region in which no pattern is formed can be clearly distinguished from one another.

Next, descriptions are given of the measurement of the line width of the thin-film pattern. In a thin film, the rising edge and the falling edge positions can be clearly detected as described above. However, as shown in FIG. 10B, the edge widths are far smaller than the pixel resolution of the SEM image, and the position information of the edge widths do not appear in the profile of the difference image of L−R. Accordingly, the pattern width cannot be measured using edge width information in the profile as in the case of the COG pattern described above.

Descriptions are given below of a method of measuring the line width of the thin-film pattern.

Figure 10A:
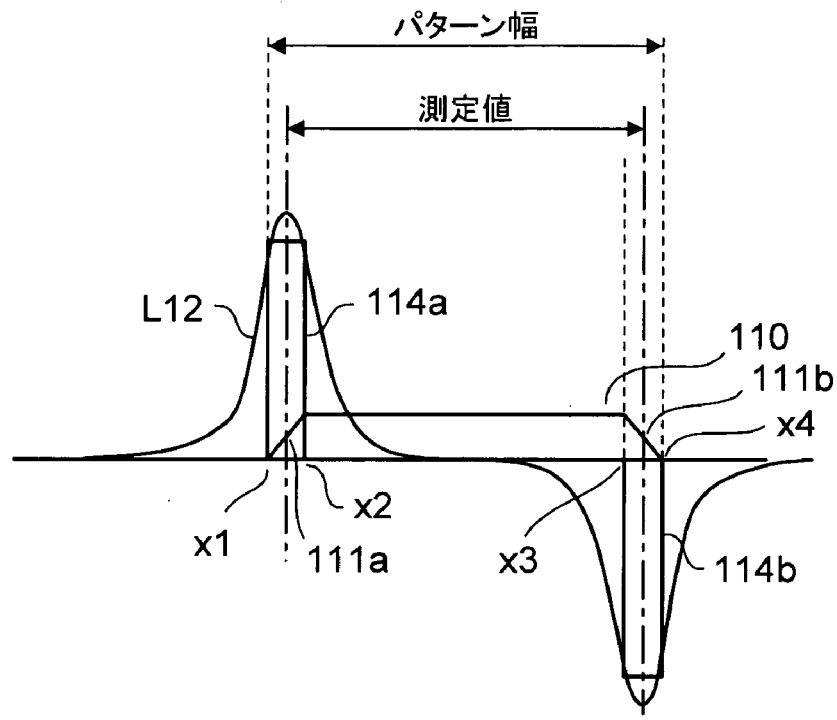

FIG. 10A is a view showing a line profile L12 of a pattern 110. The width of the pattern 110 is equal to a distance from an outer end x1 of an edge 111a to an outer end x4 of an edge 111b. However, the end positions of the edge cannot be determined from an actual line profile.

In the embodiment, the peaks of the line profile L12 are each assumed to be the center of the width of the corresponding edge. Furthermore, it is also assumed that the edge width (|x1−x2|) of the rising edge is the same as the edge width (|x3−x4|) of the falling edge. The edge width (stored in the storage unit 55 in advance) calculated from the edge angle and a film thickness assumed from of a design value is added to a measured value (distance from the positive peak position to the negative peak position of the line profile L12). The resultant value is set to be the line width of the pattern 110.

Figure 10C:
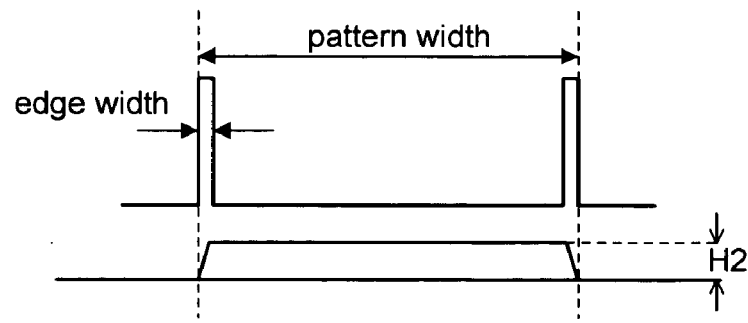

FIG. 10B shows results of measuring the edge width of a thin-film pattern as shown in FIG. 10C, each result corresponding to a certain combination of the film thickness and the edge inclination angle. For example, if the film thickness H is 5 nm and the edge inclination angle is 85°, the edge width is 0.44 nm.

As shown in FIG. 10B, the edge width is small in the thin film. Thus, in the case where an image resolution is 100K times (one pixel is approximately 1.4 nm), information on the edge width does not appear in the line profile. A value close to the actual line width can be calculated by adding the pre-calculated edge width to the value calculated from the line profile.

Note that, the line width measurement of the thin-film pattern described with reference to FIGS. 10A to 10C can be applied similarly to the case where the edge angle is almost 90° and the edge width is small.

Figure 11:
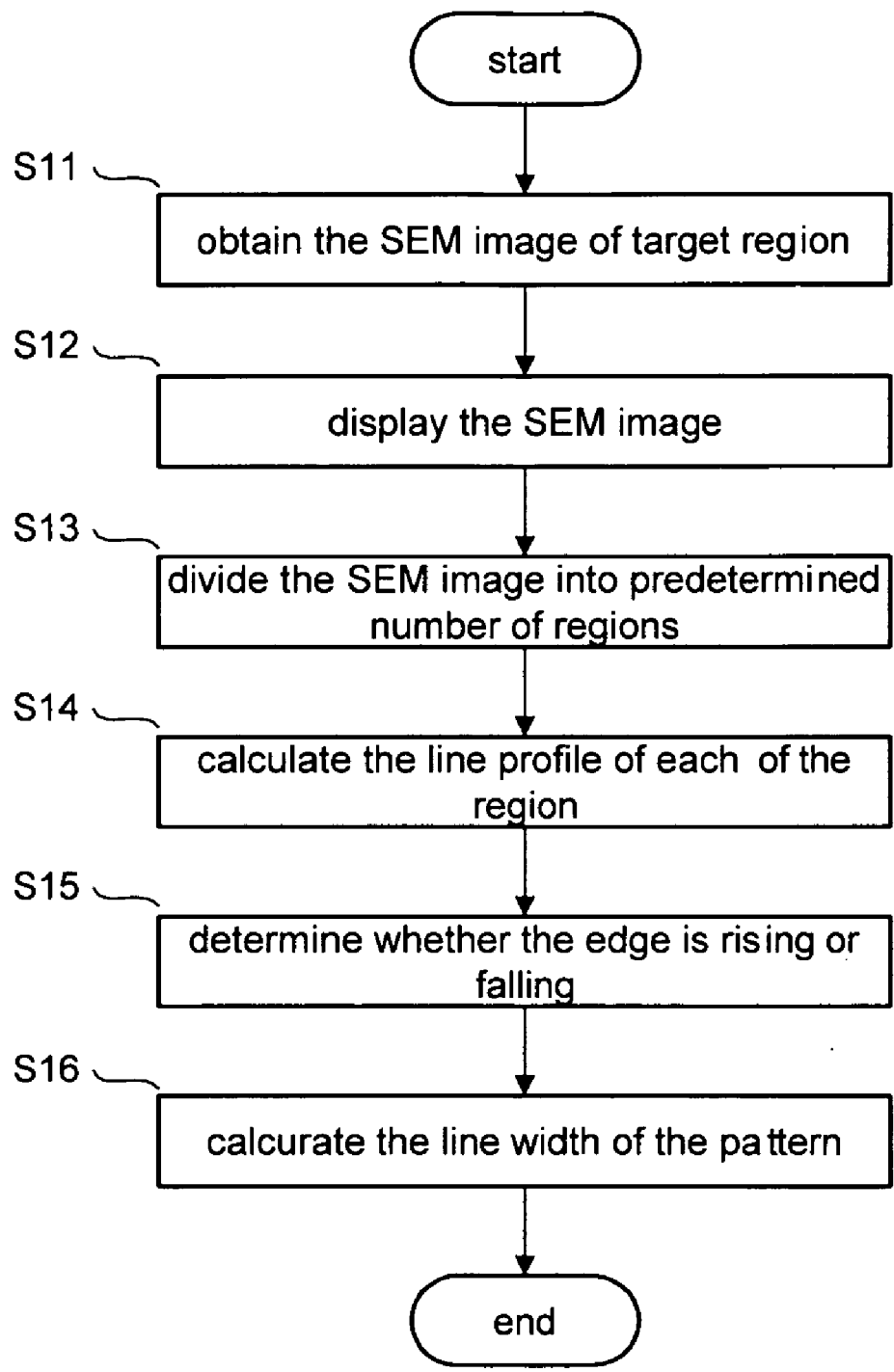
FIG. 11 is a flowchart showing an example of pattern measurement processing.

Next, descriptions are given of a method of measuring a pattern by a charged particle beam with reference to FIG. 11. FIG. 11 is a flowchart showing an example of pattern measurement processing in which the line pattern is clearly displayed and the line width is measured. In the pattern measurement processing of FIG. 11, it is assumed that the storage unit 55 stores SEM image data (left SEM image data) generated based on the amount of electrons detected by the electron detectors arranged on the left side of the pattern and SEM image data (right SEM image data) generated based on the amount of electrons detected by the electron detectors arranged on the right side, for a sample with a pattern formed in advance, on the basis of the detected amount of electrons from each of the electron detectors.

In Step S11 of FIG. 11, the SEM image of a target region is obtained. A desired inspection area is designated, and the left SEM image data and the right SEM image data of the target region are extracted from the storage unit 55. Then, an image data obtained by subtracting the right SEM image data from the left SEM image data is generated. At this time, the values of the image data are adjusted to displayable values by adding a certain pixel value, for example, 128 thereto.

Next, in Step S12, the SEM image is displayed based on the calculated image data. In the SEM image, the rising edge and the falling edge are both. highlighted. For example, as shown in FIG. 9E, the SEM image portion 96c corresponding to the rising edge has high luminance and is displayed in white, while the SEM image portion 96d corresponding to the falling edge has low luminance and is displayed in black. Accordingly, the portion in which the pattern is formed and the portion in which no pattern is formed can be displayed in a manner clearly distinguishable from one another.

Steps S13 to S16 subsequent to Step S12 are steps in which the line width of the pattern is measured. In Step S13, the SEM image data obtained in Step S11 is divided into predetermined number of regions.

Next, in Step S14, the line profile in each of the regions divided in Step S13 is calculated. In the calculation of the line profile, the profile generator 21 of the controller 20 extracts the luminance information in the SEM image data. The edge positions are calculated from the line profile for all of the regions in the measurement area. Then, the average value of the edge positions is calculated, and is set as the value of the edge position in the designated area.

Then, in Step S15, it is determined whether the edge portion of the pattern is rising or falling. If the line profile is generated by using the SEM image data obtained by subtracting the right SEM image data from the left SEM image data, the position of the positive peak value is determined as the rising edge position and the position of the negative peak value is determined as the falling edge position.

Subsequently, in Step S16, the line width of the line pattern is calculated by calculating the distance between the position of the rising edge of the pattern and the position of the falling edge opposite to the rising edge of the pattern which are determined in Step S15.

Note that, if the film thickness of the pattern is, for example, 10 nm or less and is small, the line width of the pattern may be set as follows. The rising edge and the falling edge of the pattern are assumed to have the same width, and the edge width corresponding to the film thickness of the pattern which is assumed in advance from the design value is added to the distance between the edges calculated in Step S16.

Moreover, for a pattern with a film thickness of, for example, 70 nm or more, the edge inclination angle can be calculated as follows. If the line profile generated in Step S14 has a step at a position near the peak position in the course to the peak, the width of a mountain on a side of the step closer to the peak, for example, a distance from the endpoint position to a position on an opposite side of the peak to the endpoint position is set as the edge width, the position indicating the same signal value as that at the endpoint position. Then, the edge inclination angle is calculated based on the edge width and the height of the pattern.

As described above, in the pattern measurement apparatus and the pattern measurement method of the embodiment, the SEM image of the pattern is formed as follows. In the pattern measurement apparatus including the plurality of electron detectors, the difference between the amount of electrons detected by the electron detectors arranged on one edge side of the pattern and the amount of electrons detected by the electron detectors arranged on the other edge side of the pattern is calculated. The SEM image of the pattern is formed based on the amount of electrons corresponding to the difference. Thus, the luminance of the edge portion is emphasized, and the region in which the pattern is formed and the region in which no pattern is formed can be displayed to be clearly distinguished from one another.

Moreover, the line profile is generated based on the amount of electrons corresponding to the difference obtained by subtracting the amount of electrons detected by the electron detectors arranged on the right side of the pattern from the amount of electrons detected by the electron detectors arranged on the left side of the pattern. In the line profile, the positive peak position corresponds to the rising of the edge of the pattern, and the negative peak position corresponds to the falling of the edge of the pattern. Accordingly, it can be easily determined whether the edge of the pattern is rising or falling without performing primary differentiation or secondary differentiation of the line profile.

What is claimed is:

1. A pattern measuring apparatus comprising:
a display unit;
an irradiation unit for irradiating a sample with a charged particle beam;
a first electron detector and a second electron detector for detecting an amount of electrons emitted from the sample with a pattern by the irradiation with the charged particle beam, the first electron detector and the second electron detector arranged with an optical axis of the charged particle beam in between;
an image processor for generating image data of the pattern on the basis of the amount of electrons; and
a controller for calculating a subtracted signal by subtracting a signal detected by the second electron detector from a signal detected by the first electron detector, causing the image processor to generate the image data of the pattern on the basis of an amount of electrons corresponding to the subtracted signal, and displaying an image corresponding to the image data on a screen of the display unit.

2. The pattern measuring apparatus according to claim 1 further comprising a line profile generator for generating a line profile of the pattern formed on the sample, on the basis of the amounts of electrons detected by the first and second electron detector, wherein
if the first electron detector is provided on a left side of the pattern and the second electron detector is provided on a right side of the pattern, the controller determines that a positive peak position of the line profile generated by the line profile generator and corresponding to the subtracted signal is rising of an edge of the pattern, and that a negative peak position of the line profile is falling of an edge of the pattern.

3. The pattern measurement apparatus according to claim 2, wherein, if the line profile corresponding to the subtracted signal has a step at a position near the position of any one of the peaks in the course to the peak, the controller sets a width of a mountain on a side of the step closer to the peak, as an edge width.

4. The pattern measurement apparatus according to claim 3, wherein the controller sets a distance from an endpoint position of the step on the peak side to a position on an opposite side of the peak to the endpoint position as the width of the mountain, the position indicating the same signal value as that at the endpoint position.

5. The pattern measurement apparatus according to claim 3, wherein the controller obtains a differentiation profile by differentiating the line profile, and sets a distance from a position of a maximum value to a position of a minimum value as the width of the mountain, the maximum value and the minimum value being those of the differentiation profile in a region at the peak side of the step.

6. The pattern measuring apparatus according to claim 4, wherein the controller calculates an inclination angle of each of the edges of the pattern on the basis of the edge width and a height of the pattern.

7. The pattern measuring apparatus according to claim 3, wherein, for the edge width from a position X1 to a position X2 (>X1) detected based on a positive peak in the line profile and for the edge width from a position X3 (>X2) to a position X4 (>X3) detected based on a negative peak adjacent to the positive peak, the controller calculates a distance from the position X1 to the position X4 as a bottom width of the pattern.

8. The pattern measuring apparatus according to claim 3, wherein the controller assumes that a rising edge and a falling edge of the pattern have the same width at least if an edge angle of the pattern is substantially equal to a right angle or a film thickness of the pattern is smaller than a predetermined thickness, calculates the distance from the positive peak position to the negative peak position of the line profile, and sets a value obtained by adding an edge width detected in advance based on the film thickness of the pattern and the inclined angle of the edge to the distance, as a line width of the pattern.

9. A pattern measuring method in which a sample is irradiated with a charged particle beam to measure a pattern formed on the sample on the basis of an amount of electrons emitted from the sample, the pattern measuring method comprising the steps of:
obtaining a first SEM (Scanning Electron Microscope) image of the pattern formed on the sample on the basis of a first amount of electrons detected by first electron detector among the first electron detector and second electron detector arranged with an optical axis of the charged particle beam in between;
obtaining a second SEM image of the pattern formed on the sample on the basis of a second amount of electrons detected by the second electron detector;

obtaining a third SEM image of the pattern on the basis of a third amount of electrons corresponding to subtraction of the second amount of electrons from the first amount of electrons; and displaying the third SEM image on a screen of display unit.

10. The pattern measuring method according to claim 9, further comprising the steps of:
generating a line profile of the pattern on the basis of the third amount of electrons; and
if the first electron detector is provided on a left side of the pattern and the second electron detector is provided on a right side of the pattern, determining that a positive peak position of the line profile is rising of an edge of the pattern and that a negative peak position of the line profile is falling of an edge of the pattern.

11. The pattern measuring method according to claim 10 further comprising the step of, if the line profile has a step at a position near the position of any one of the peaks in the course to the peak, setting a width of a mountain on a side of the step closer to the peak, as an edge width.

12. The pattern measuring method according to claim 11, wherein, in the step of setting the width of the mountain on side of the step closer to the peak as the edge width, a distance from an endpoint position of the step on the peak side to a position on an opposite side of the peak to the endpoint position is set as the width of the mountain, the position indicating the same signal value as that at the endpoint position.

13. The pattern measuring method according to claim 11, wherein the step of setting the width of the mountain on a side of the step closer to the peak, as the edge width includes the steps of:
obtaining a differentiation profile by differentiating the line profile; and
setting a distance from a position of a maximum value to a position of a minimum value as the width of the mountain, the maximum value and the minimum value being those of the differentiation profile in a region on a side of the step closer to the peak.

14. The pattern measuring method according to claim 11 further comprising the step of calculating an inclination angle of each of the edges of the pattern on the basis of the edge width and a height of the pattern.

15. The pattern measuring method according to claim 11 further comprising the steps of:
detecting a positive peak and a negative peak adjacent to the positive peak from the line profile;
calculating an edge width from a position X1 to a position X2 (>X1) detected based on the positive peak;
calculating an edge width from a position X3 (>X2) to a position X4 (>X3) detected based on the negative peak; and
calculating a distance from the position X1 to the position X4 as a bottom width of the pattern.

16. The pattern measuring method according to claim 10 further comprising the steps of:
calculating the distance from the positive peak position to the negative peak position of the line profile, if an edge angle of the pattern is substantially equal to a right angle or a film thickness of the pattern is smaller than a predetermined thickness at least, while assuming that the rising edge and the falling edge of the pattern have the same width; and
calculating a line width of the pattern by adding an edge width detected in advance based on the film thickness of the pattern and the inclined angle of the edge to the distance.

* * * * *